Figure 1:
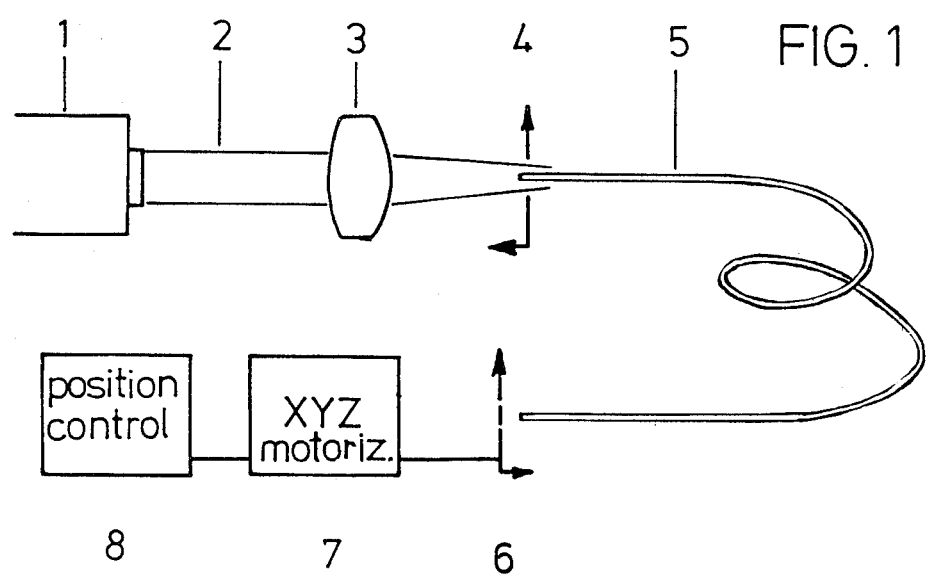

United States Patent [19]

Laude

[11] Patent Number: 4,469,551
[45] Date of Patent: Sep. 4, 1984

[54] METHOD FOR CRYSTALLIZING FILMS

[75] Inventor: Lucien D. Laude, Hautmont, France

[73] Assignee: L'Etat Belge, représenté par le Secrétaire Général des Services de la Programmation de la Politique Scientifique, Brussels, Belgium

[21] Appl. No.: 302,753

[22] Filed: Sep. 16, 1981

[30] Foreign Application Priority Data

Sep. 18, 1980 [LU] Luxembourg .......................... 82779
Aug. 10, 1981 [LU] Luxembourg .......................... 83540

[51] Int. Cl.³ ............................................... C30B 1/04
[52] U.S. Cl. .............................. 156/603; 156/DIG. 80
[58] Field of Search ............. 156/DIG. 80, DIG. 88, 156/603, 617 R; 427/53.1; 423/348

[56] References Cited

U.S. PATENT DOCUMENTS

| | | | |
|---|---|---|---|
| 3,585,088 | 6/1971 | Schwuttke et al. | 156/DIG. 80 |
| 4,059,461 | 11/1977 | Fan et al. | 156/DIG. 80 |
| 4,323,417 | 4/1982 | Lam | 156/DIG. 80 |
| 4,333,792 | 6/1982 | Smith | 156/DIG. 88 |
| 4,340,617 | 7/1982 | Deutsch | 427/53.1 |

Primary Examiner—Hiram H. Bernstein
Attorney, Agent, or Firm—Fleit, Jacobson, Cohn & Price

[57] ABSTRACT

There is described a method for crystallizing films selected from the group comprising the amorphous elementary semi-conducting films and the polymetallic films comprised of two elements belonging respectively to Groups III and V, or Groups II and VI of the Periodic Table, which comprises irradiating the film surface with a laser beam guided by an assembly from optic fibers which are arranged in parallel relationship with one another, each fiber having a diameter which is not larger than 50μ, said irradiating causing crystallizing into crystallites which are regularly distributed and closely confined.

31 Claims, 3 Drawing Figures

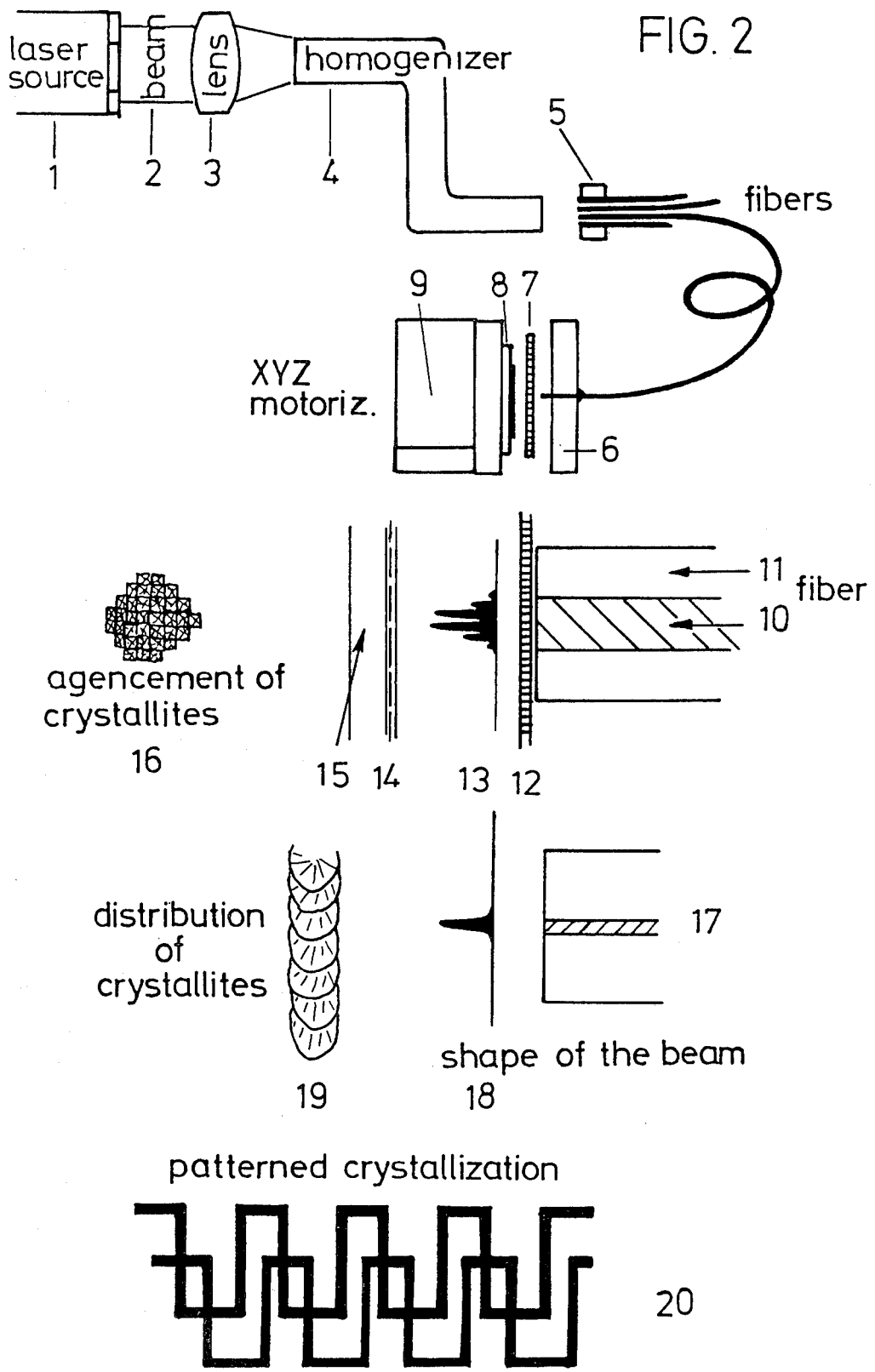

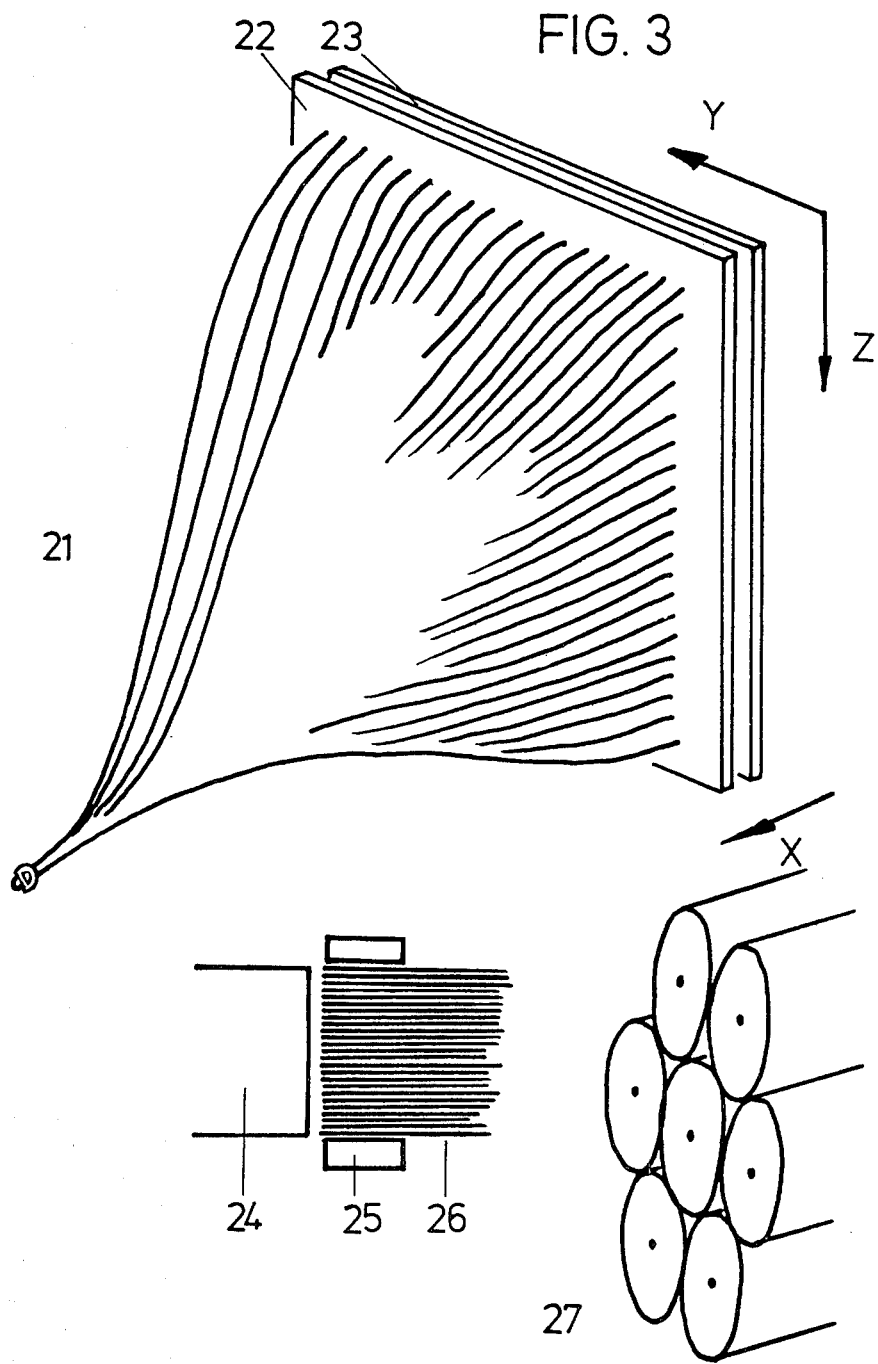

METHOD FOR CRYSTALLIZING FILMS

This invention relates to a method for crystallizing films selected from the group comprising the amorphous elementary semi-conducting films and the polymetallic films comprised of two elements belonging respectively to Groups III and V, or Groups II and VI of the Periodic Table, as well as to the resulting polycrystalline semi-conducting films.

The miniaturizing of electronic circuits is one of the main objects of the electronic and data processing industry. Present techniques make use of selective doping processes for chips from monocrystalline silicone with various masks, the accuracy of which is determinant for the development limits for such circuits. Said methods are very costly, very delicate to operate and but a few systems have been developed which are reliable and have a large capacity. Said systems are made from monocrystalline silicon, which requires the availability of said material in sufficient quality and amount to produce the circuits. All of the methods are divided into a plurality of steps, each such step being characterized by a large number of parameters which have to be accurately monitored: preparation of the crystal, masking, doping. Said parameters make the embodying of miniaturized circuits a very intricate problem which could not be generalized for other basic materials than silicon, for example, without a complete change in all of the parameters. The lack of flexibility of such techniques and the intricacy thereof underline the need for a new technique which is simpler and more easily adpated to other carriers than monocrystalline Si.

This invention has for object to obviate the above drawbacks and to provide methods for crystallizing amorphous elementary semi-conducting films or polymetallic films comprised of two elements belonging respectively to Groups III and V, or Groups II and VI of the Periodic Table, which have a reliability at least identical to the methods used up to now, and which moreover allow a more advanced miniaturizing and a simultaneous multiplying on a large scale of the resulting products.

For this purpose according to the invention, the surface of the film to be crystallized is irradiated with a laser beam guided by an assembly from optic fibers which are arranged in parallel relationship with one another, each fiber having a diameter which is not larger than 500$\mu$, said irradiating causing crystallizing into crystallites which are regularly distributed and closely confined.

In a particularly advantageous embodiment of the invention, said optic fibers have a diameter equal to 50$\mu$ and preferably a diameter between 4 and 25$\mu$, the parallel optic fiber assembly having a diameter which is substantially equal to the diameter of the laser beam, said fiber assembly comprising a very large number of fibers, preferably between 300 and 15,000, the fiber number varying according to the useful diameter of said fibers and the useful diameter of the laser beam.

In another particular embodiment of the method according to the invention, the laser beam is homogenized before being guided by the fiber assembly, by passing through a cylinder-shaped quartz rod with an input diameter substantially equal to the laser beam diameter, bent twice at right angles along opposite directions, coated with a metal layer, the input and output ends of said rod being polished, in parallel relationship with one another and at right angle to the axis thereof.

Advantageously, a regular crystallite network or circuit is obtained on the film being irradiated by moving same in a plane at right angle to the fiber axis, the printing fineness of the crystallite network or circuit being controlled by the film moving rate.

This invention has also for object to provide a method allowing to multiply the printing of a regular crystallite network or circuit on a single film or an assembly from elementary or polymetallic semi-conducting films belonging to the above-defined film class.

The above-defined objects are obtained by using the radiation generated by a laser the energy and operating sequence (pulsated or continuous) of which are adapted to the thickness of the film to be treated. The laser beam energy is collected with an optic fiber assembly with a diameter smaller than or equal to 50$\mu$, preferably lying between 4 and 25$\mu$, which is directed towards a target comprised of an amorphous elementary semi-conducting film, or of a polymetallic film formed by two elements belonging respectively to Groups III and V, Groups II and VI of the Periodic Table. Under the beam impact, the amorphous elementary film crystallizes regularly and is confined to very small volumes which are determined by the fiber diameter and the spacing between the fiber output end and the target. With identical volumes, the polymetallic film crystallizes in the form of the corresponding semi-conducting compound, the remainder of the film (unirradiated) remaining metallic. By means of a programmed displacement of said target in a plane at right angle to the fiber axis, a regular crystallite network is then optically "printed" on the film the electronic carrying capacities (mobility and carrier number) of which are thus strongly changed with a plurality of magnitude ranges, inside irradiated areas relative to unirradiated areas. The use of a very large number N of identical fibers which each carry the same energy, then allows to reproduce N times the programmed circuit and to make the possibly required interconnecting of said N circuits. Targets which did appear as particularly suitable for this purpose, are those semi-conducting films formed by Si or Ge, and those polymetallic films comprised of an alternating sequence of aluminum and antimony layers, aluminum and arsenic layers, gallium and arsenic layers, indium and phosphorous layers (Groups III and V), or cadmium and sulfur layers, cadmium and tellurium layers (Groups II and VI).

Other details and features of the invention will stand out from the following description, given by way of non-limitative example of some particular embodiments of the invention.

FIGS. 1-3 will aid in understanding the following description of the invention.

FIG. 1 is a schematic showing:
(1) laser source,
(2) laser beam,
(3) lenses,
(4) entrance of fiber, mounted on manually controlled XYZ manipulator,
(5) quartz fiber, being either graded index or step index,
(6) XYZ manipulator on which film is mounted,
(7) XYZ motorization, being a step-motor on each of the directions,
(8) computer providing position control through XYZ motorization.

FIG. 2 is another version of FIG. 1 showing:
(1) laser source,
(2) laser beam,
(3) lenses,
(4) quartz pipe homogenizer,
(5) ring fastening together a set of fibers,
(6) base mounting of the fiber, being fixed,
(7) metallic grid or quartz grating,
(8) film on substrate,
(9) three step-motors attachment on which sample is mounted,
(10) core of graded index fiber ($\phi$ 50 micron),
(11) cladding of fiber ($\phi$ 125 micron),
(12) as in 7,
(13) structured beam intensity after passing the beam through fiber and grid (or grating),
(14) film made of a stack of individual metallic films as described in text,
(15) insulating substrate,
(16) agencement of crystallites formed in films upon lasing through optical set-up described in 1-15,
(17) end of step-index quartz fiber (core $\phi$ 7 microns),
(18) shape of the beam upon reaching the film,
(19) distribution of crystallites obtained upon scanning the film with beam 18 and using XYZ motorization,
(20) example of patterned crystallization (in black is the series of aligned crystallites of given compound within untransformed parts of the film) obtained by programming two loop-hole scannings displaced from each other by 30 Å (loop-holes are 100×50 micron).

FIG. 3 shows:
(21) set of 18×18 step-index fibers assembled with ring at one end and distributed over a 2×2 cm² fixed table as in 6,
(22) 2×2 cm² table,
(23) table on which a 2×2 cm² film is mounted, being displaced along XYZ directions as in 9,
(24) end of quartz pipe homogenizer,
(25) ring as in 5,
(26) set of identical step-index fibers,
(27) agencement of the fibers in 26 before spatial distribution.

The following description will more particularly pertain to the shaping of the laser beam, the sweeping of the irradiated surfaces by moving the irradiated film or films, and the simultaneous reproducing in a large copy number of a regular crystallite network or circuit on a single film (target) or film assembly (different targets).

1. Shaping of the laser beam.

Depending on the thickness of those films to be treated which may reach up to 25$\mu$, the laser radiation may have various origins, for instance; pulsated dye laser with medium power and low energy (50 to 100 mJ/cm²) for thin films with a thickness thinner than or equal to 0.2$\mu$ on glass, or pulsated ruby laser with high power but low energy (50 to 100 mJ/cm²) for films with a thickness in the range from 1 to 2$\mu$, also deposited on non crystalline substrate, for example glass or melted silica, or continuous gas laser with high energy (1 to 5 J/cm²) for films having a thickness thicker than 2$\mu$, up to 25$\mu$, and also deposited on the very same substrates. Whatever be the laser beam, said beam is arranged facing an assembly from identical quartz fibers in parallel relationship with a diameter smaller than or equal to 50$\mu$, assembled with a diameter which is equal to the beam diameter, the laser beam entering all of the fibers along the respective lengthwise axis thereof. The fibers for instance 1000 to 2000 thereof, all have an equal diameter, the fiber number being limited but by the useful beam diameter over which said beam is homogeneous and by the fiber diameter. Each fiber is polished at the ends thereof. Such work is made by assembling compactly all of the fibers which are retained at each end thereof by a metal ring with a diameter which is equal to or smaller than the useful beam diameter. Mounted in such a way, all of the fibers are polished together succeedingly at both ends thereof, with an abrasive on a turntable. The respective ends of the assembled fibers are all located in a same plane lying at right angle to the lengthwise axis of each such fibers. Those fiber ends facing the laser beam are then retained in the assembly ring thereof, the opposite ends being released from the ring thereof.

As already mentioned, in a preferred embodiment of the invention, before being guided by the fiber assembly, the laser beam may be made homogeneous by passing through any suitable known optical means in the art. The homogenizer being used is preferably a cylinder-shaped quartz rod, with an input diameter equal to the laser beam diameter, bent twice at right angles along opposite directions, coated with a metal layer, for example an aluminum layer, the rod input and output ends being polished, in parallel relationship with one another and at right angles to the axis thereof. The laser beam may possibly be focused by a lens system at the input to the rod. When one makes use of a homogenizing rod of this type, those fiber ends facing the homogenized beam are retained in the assembly ring thereof, which is then contacted with the rod output, the opposite ends being of course released from the ring thereof, as already mentioned.

As all the fibers are identical and receive each the same energy (to some ±1%), the capacity of each fiber to convey without loss the radiation (either by absorption or by side transmission), then allows to have a very large number of light sources with identical energy, over identical diameters. According to the energy being required, the laser beam may be lowered by one or a plurality of metered filters which are located in the beam path before the fiber input. After passing through the optical fiber assembly, said laser beam may be structured, for example by passing through an optical means so arranged as to generate interference fringes, said optical means may be comprised either of an etched quartz optical network, or of a Fresnel's lens. Said beam structuring may also be made by passing said beam through a metal grid or screen with a regular and very fine mesh (20×20$\mu$ for instance) which is arranged at right angle to the fiber axis.

2. Crystallizing and sweeping of the films.

When the network is not being used, the beam which comes out from a fiber end has a granular or "speckle" structure, that is the impact thereof on a surface splits into an array of substantially circular spots which are distributed homogeneously and stably from one irradiating to another one. The size of such light spots is given by $$\Delta = \frac{\lambda}{tg\alpha},$$

in which $\lambda$ is the wave length of the radiation and $\alpha$ the angle at which each location of that target comprised by the film sees the radius R of the fiber. If $$tg\alpha = \frac{R}{d} \rightarrow \Delta = \frac{\lambda}{R} d,$$

with d the spacing between target and fiber. It is clear that for a given fiber and a fixed wave length, Δ increases together with d. To the contrary, Δ decreases when R increases, with d being constant. Such a kind of irradiating produces star-like crystallites with a number and size identical with the speckle spots, covering all of the irradiated surface the diameter of which is equal to the fiber diameter. By acting on the speckle (thus on Δ, R and d), it is thereafter easy to vary the crystallite size, particularly to produce a single star-like crystallite with a diameter equal to the fiber diameter.

By cutting-in an optical network in the beam path, each speckle spot is fringed and the resulting stars are structured.

In pulsated operation, as no altering of the crystallized areas produced during a pulse is observed when a pulse train is superimposed on the very same areas, the film surface to be irradiated is moved past a fixed fiber end, that is in a plane at right angle to the axis of said fiber, to allow overlapping of the irradiated areas from the one pulse to the following one, which thus allows obtaining a regular crystallite network or circuit. Said overlapping determines the fineness of the crystallized circuit print on the film, which fineness is controlled by varying on the one hand the film movement rate, that is actually the sweeping rate of the film surface by means of the laser radiation conveyed by the optical fibers, and on the other hand the pulse-recurrence rate of the laser.

In continuous mode, the crystalline growth obtained under the action of the laser being in any case much faster than the practical sweeping rates and taking into account the above, no particular care is to be taken and the sweeping in the continuous laser mode may be notably faster than in the pulsated mode.

3. Method allowing to multiply the print of a regular crystallite network or circuit.

As already stated above, this invention also provides a method allowing to multiply the print of a regular crystallite network or circuit on a single film or on an assembly of films selected in that group comprising amorphous elementary semi-conducting films and polymetallic films comprised of two elements belonging respectively to Groups III and V, or Groups II and VI of the Periodic Table. The output ends of the fibers mounted along the axis of the beam which has been shaped as described above, are assembled on a plane-frame according to a geometric shape suitable for the number of fibers and the extent of the crystallite network or circuit to be printed. The assembly on the frame is such that all of the fibers lie in parallel relationship with one another and the ends thereof lie in a plane in parallel relationship with said frame plane. Facing said frame in parallel relationship therewith, another plane-frame is arranged on which is mounted either the film to be irradiated covering the whole surface area of said frame, or the assembly of films to be irradiated, distributed according to a geometric figure identical with the geometrical figure of the frame-mounted fibers, to adapt the extent of the crystallite network or circuit to be made in a number of units which is equal to the number of fibers (each fiber lying directly facing a given film). The spacing between the frames bearing the film or films, which comprise the target, and the frame bearing the fibers is so adjusted as to have the spacing between fiber and film corresponding to the required print (see in this regard point 2 above). The fiber frame remains fixed while that frame bearing the film or films is movable in the plane thereof, at a fixed distance from the fiber frame. A traversing movement is then imparted to the film frame. Said movement lets each fiber print optically a regular crystallite circuit or network on the single film or on each film mounted on said frame.

It is also possible according to the invention, to make the interconnecting of regular crystallite networks or circuits obtained on one and the same polymetallic film comprised of two elements respectively from Groups III and V, or Groups II and VI of the Periodic Table, by using the same fiber array as used for making networks or circuits, and by moving the film frame in such a way that the impact of the laser beam as channeled by the fiber prints the required semi-conducting contacts between each network or circuit and the directly adjacent ones (first neighbours) on the film.

It will be noticed in the light of the above, that the size and distribution of the crystallites on the film or films to be irradiated, whatever be the crystallizing process being used, can be controlled as a function of the optical fiber diameter, the fiber-film spacing, as well as the wave-length, energy and power of that laser beam irradiating the film.

The shaping of the laser beam being stable in space, it is possible to irradiate succeedingly under the same energy conditions, two superimposed films, which allows an epitaxial crystallizing of the second film covering the first film, that is an accurate superimposing of those crystallites belonging to each said films. Such an example of superimposed films is the system Si/Al-Sb which is obtained by evaporating an amorphous Si layer on an Al-Sb film which has been previously crystallized according to the invention in the form of the semiconducting AlSb compound, the Si film being irradiated by the same laser beam in an identical way.

The following examples illustrate the invention without however limiting same.

EXAMPLE 1.

Germanium film.

The following experiments and tests have been made with optical fibers having a diameter equal to 50μ, the results being obtained may of course be extrapolated to any fiber diameter, particularly to fibers with a diameter smaller than 50μ.

For the pulsated laser (dye laser, power 6 kW with pulses having a $10^{-6}$ sec. duration with a recurrence rate of 25 sec.$^{-1}$), the following results have been recorded:

a homogeneous beam with a 2 mm useful diameter has been generated, capable of feeding 300 fibers with a useful diameter equal to 50μ;

over the irradiated germanium film areas, with a 50μ diameter, there has been obtained a homogeneous distribution of star-shaped crystallites, all of the same diameter selected in the range from 2 to 25 μ depending on the irradiating conditions, said homogeneous distribution being reproducible. A single star with a 50μ diameter has been obtained by locating the target film 2 mm away from the fiber end and by focusing slightly the beam, the energy per surface area unit then being lowered;

with a 90% overlapping between succeeding irradiated areas, the target film movement with a speed c 0.12 mm sec$^{-1}$ allows to define the print limits to ±0.3%, that is 0.13μ, in such a way that very large crystallites (mean length 100μ, up to 200μ) of dendritic type are generated along the sweeping direction in that trace (width 50μ) which is bounded by an area with a few microns depth which is comprised of small crystallites (~5μ).

EXAMPLE 2.

Germanium film.

For fibers with 7μ useful diameter, the miniaturizing of the crystallized area is as follows:
a single crystallite by impact with a size equal to 7μ for a film-fiber spacing d equal to 40μ;
for a 90% overlapping between succeeding irradiated areas, a movement rate of 0.017 mm sec$^{-1}$ allows an edge definition of ±0.25%, that is 0.017μ.

It will be noted that the advantages of the fibers with a very small diameter relative to the fibers with a 50μ diameter lie in a better definition of the traces, in a lowering of the intensity required from the radiation at the source thereof, in a higher sweeping rate, and in a much more substantial multiplying of the circuits obtained (in the range of 15000 instead of 300 with 50μ fibers).

EXAMPLE 3.

AlSb film.

For a continuous gas laser (krypton, energy 3J/cm$^2$), irradiating by sweeping of the beam as channeled by a fiber with a diameter of 50μ or 7μ over a polymetallic Al-Sb film with a thickness equal to 7μ results in the converting into the semi-conducting compound AlSb along the path of the light spot over the film, the remaining film portion remaining metallic.

It must be understood that the invention is in no way limited to the above embodiments and that many changes may be brought thereto without departing from the scope of the invention as defined by the appended claims.

For instance, as substrates to deposit films, use is made preferably of non-crystalline or amorphous substrates, such as plates from glass or melted silica, cleaned by ion bombardment with a neutral gas such as for example argon, during a few minutes, for example from 1 to 5 minutes.

I claim:

1. Method for crystallizing films selected from the group comprising the amorphous elementary semiconducting films and the polymetallic films comprised of two elements belonging respectively to Groups III and V, Groups II and VI of the Periodic Table, which comprises irradiating the film surface with a laser beam guided by an assembly from optic fibers which are arranged in parallel relationship with one another, each fiber having a diameter which is not larger than 50μ, said irradiating causing crystallizing into crystallites which are regularly distributed and closely confined.

2. Method as defined in claim 1, in which said optic fibers have a diameter equal to 50 microns.

3. Method as defined in claim 1, in which said film is deposited on a non-crystalline substrate.

4. Method as defined in claim 1, in which said optic fibers have a diameter lying between 4 and 25 microns.

5. Method as defined in claim 1, in which said optic fibers each have the same diameter.

6. Method as defined in claim 1, in which use is made for said optic fibers, of identical quartz fibers.

7. Method as defined in claim 1, in which the assembly of parallel optic fibers has a diameter which is substantially equal to the laser beam diameter.

8. Method as defined in claim 7, in which the fiber assembly comprises from 300 to 15000 fibers.

9. Method as defined in claim 1, in which the optic fibers are compactly arranged, polished at each end thereof, and retained by the end thereof facing the beam by means of a metal ring with a diameter which is no larger than the useful laser beam diameter.

10. Method as defined in claim 9, in which the respective ends of the assembled fibers lie in one and the same plane which is substantially at a right angle to the lengthwise axis of said fibers.

11. Method as defined in claim 1, in which said laser beam is made homogeneous before being guided by the fiber assembly.

12. Method as defined in claim 11, in which said laser beam is made homogeneous by passing through a cylinder-like quartz rod with an input diameter which is substantially equal to the laser beam diameter, bent twice at right angles in opposite directions, coated with a metal layer, the input and output ends of the rod being polished, in parallel relationship with one another and at right angle to the axis thereof.

13. Method as defined in claim 12, in which said laser beam is focused by a lens system before being made homogeneous.

14. Method as defined in claim 1, in which the radiation from the laser beam is reduced by one or a plurality of filters lying in the beam path each at a right angle thereto, before entering the optic fiber assembly.

15. Method as defined in claim 1, in which the laser beam is structured after passing through said optic fiber assembly.

16. Method as defined in claim 15, in which said laser beam is structured by passing through an optical means to generate interference fringes.

17. Method as defined in claim 16, in which said optical means for generating interference fringes is comprised of an optic grating from etched quartz.

18. Method as defined in claim 16, in which said optical means for generating interference fringes is comprised of a Fresnel's lens.

19. Method as defined in claim 16, in which said optical means for generating interference fringes is comprised of a metal grid or screen with a regular and very fine mesh lying at a right angle to the fiber axis.

20. Method as defined in claim 1, in which said non-crystalline substrate is cleaned by ion bombardment with a neutral gas such as argon.

21. Method as defined in claim 1, in which that laser beam which irradiates said film is in pulsated mode with an energy between 50 and 100 mJ/cm$^2$.

22. Method as defined in claim 1, in which that laser beam which irradiates said film is in continuous mode with an energy between 1 and 5 J/cm$^2$.

23. Method as defined in claim 1, in which the film thickness is thinner than or equal to 0.2 microns and the laser beam is a dye pulsated laser beam.

24. Method as defined in claim 1, in which the film thickness lies between 1 and 2 microns, and said laser beam is a ruby pulsated laser beam.

25. Method as defined in claim 1, in which the film thickness lies between 2 and 25 microns, and the laser beam is a continuous gas laser beam.

26. Method as defined in claim 1, in which the size and distribution of the crystallites on the film is controlled as a function of the optic fiber diameter, the fiber-film spacing, and the wave length, the energy and the power of said laser beam which irradiates said film.

27. Method as defined in claim 26, in which the filter-film spacing lies in the range from 0.5 to 5 mm.

28. Method as defined in claim 1, in which said film is moved in a plane at a right angle to the fiber axis in such a way as to obtain a regular crystallite network or circuit.

29. Method as defined in claim 28, in which the print fineness of the crystallite network or circuit is controlled by the film movement speed and the recurrence rate of the laser pulses.

30. Method as defined in claim 1, wherein the film is an amorphous semi-conducting film formed by silicium or germanium.

31. Method as defined in claim 1, wherein the film is a polymetallic film comprised of alternating layers from aluminum and antimony, aluminum and arsenic, galium and arsenic, indium and phosphorus (Groups III and V), from cadmium and sulfur, or cadmium and tellurium (Groups II and VI).

* * * * *